United States Patent
Chou et al.

(10) Patent No.: US 9,412,759 B2
(45) Date of Patent: Aug. 9, 2016

(54) CMOS GATE CONTACT RESISTANCE REDUCTION

(71) Applicant: GLOBALFOUNDRIES INC., Grand Cayman (KY)

(72) Inventors: Anthony I. Chou, Beacon, NY (US); Arvind Kumar, Beacon, NY (US); Sungjae Lee, Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/566,779

(22) Filed: Dec. 11, 2014

(65) Prior Publication Data
US 2016/0172378 A1 Jun. 16, 2016

(51) Int. Cl.
| | |
|---|---|
| *H01L 27/12* | (2006.01) |
| *H01L 29/06* | (2006.01) |
| *H01L 29/423* | (2006.01) |
| *H01L 29/66* | (2006.01) |
| *H01L 21/311* | (2006.01) |
| *H01L 21/84* | (2006.01) |
| *H01L 21/28* | (2006.01) |

(52) U.S. Cl.
CPC ...... *H01L 27/1211* (2013.01); *H01L 21/28017* (2013.01); *H01L 21/31111* (2013.01); *H01L 21/845* (2013.01); *H01L 29/0649* (2013.01); *H01L 29/42364* (2013.01); *H01L 29/42376* (2013.01); *H01L 29/6653* (2013.01)

(58) Field of Classification Search
CPC ............... H01L 29/4983; H01L 21/28247; H01L 29/665; H01L 29/6656; H01L 21/28105; H01L 27/1203; H01L 21/84; H01L 29/66772; H01L 27/12; H01L 27/1214
USPC .......................................... 438/596; 257/347
See application file for complete search history.

(56) References Cited

U.S. PATENT DOCUMENTS

| | | | |
|---|---|---|---|
| 7,382,027 B2 | 6/2008 | Verma et al. | |
| 8,674,457 B2 | 3/2014 | Toh et al. | |
| 2007/0096212 A1* | 5/2007 | Sato | H01L 21/76895 257/350 |

\* cited by examiner

*Primary Examiner* — Walter H Swanson
(74) *Attorney, Agent, or Firm* — Scully, Scott, Murphy & Presser, P.C.

(57) ABSTRACT

A gate contact with reduced contact resistance is provided by increasing contact area between the gate contact and a gate conductive portion of a gate structure. The gate contact forms a direct contact with a topmost surface and at least portions of outermost sidewalls of a portion of the gate conductive portion, thus increasing the contact area between the gate contact and the gate structure. The gate contact area of the present application can be further increased by completely surrounding a portion of the gate conductive portion of the gate structure with the gate contact.

7 Claims, 12 Drawing Sheets

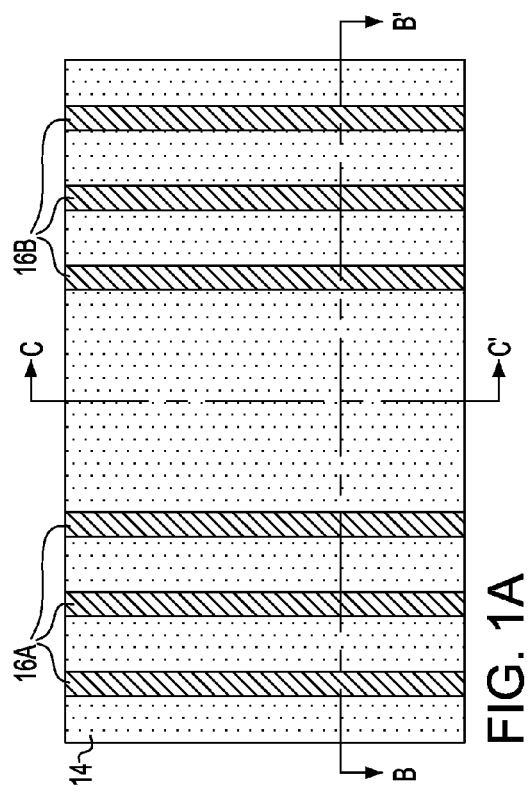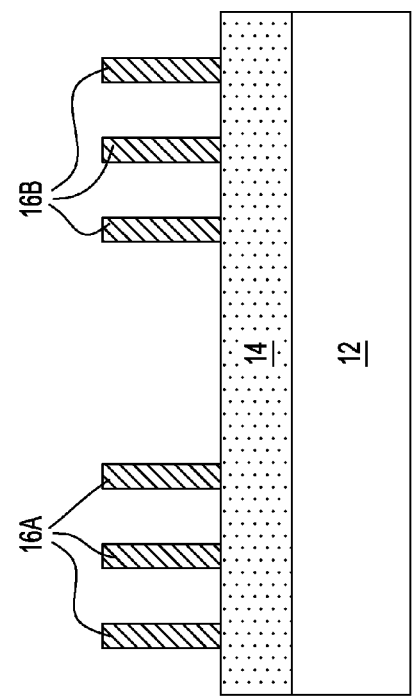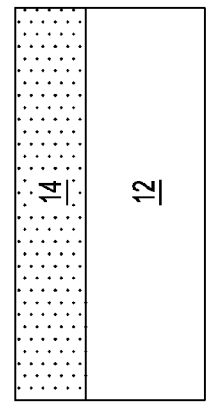

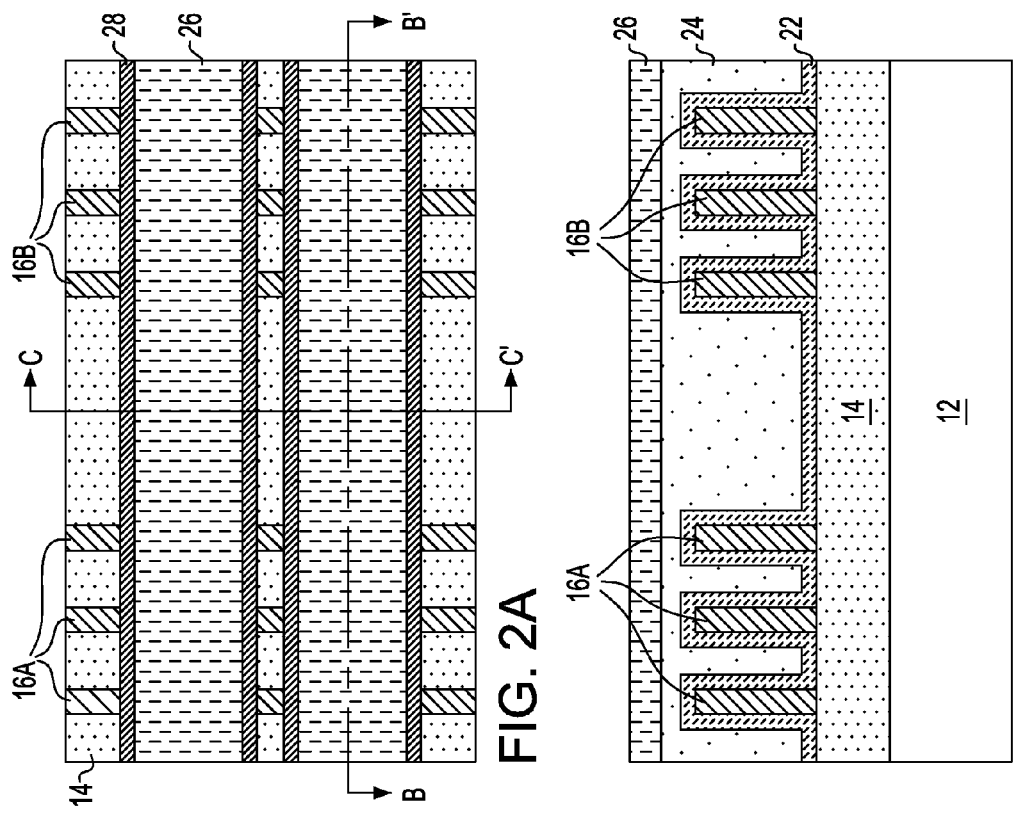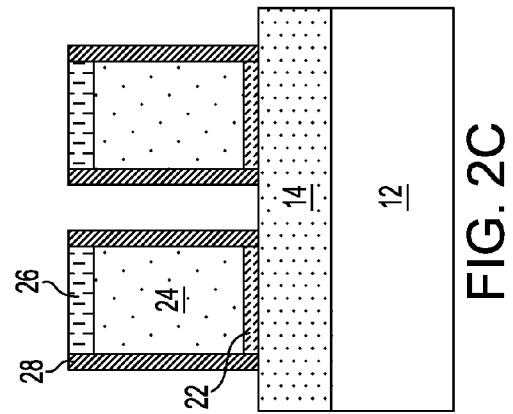

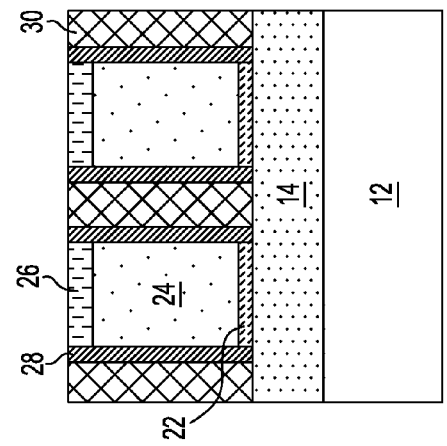
FIG. 3C
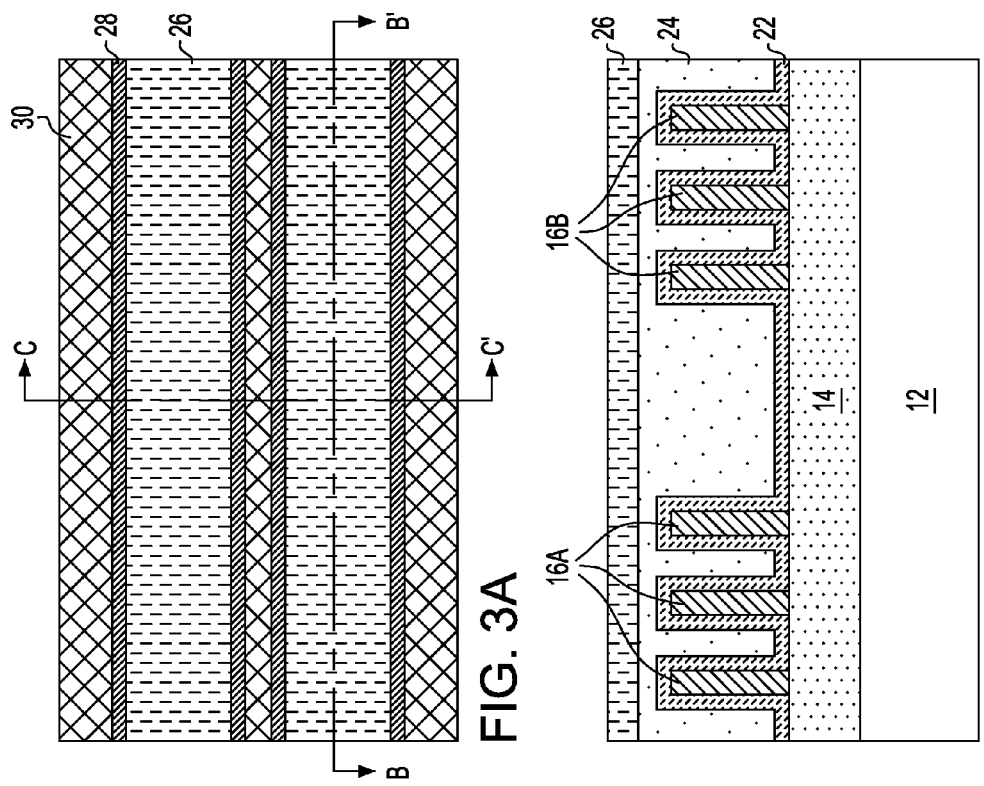
FIG. 3A
FIG. 3B

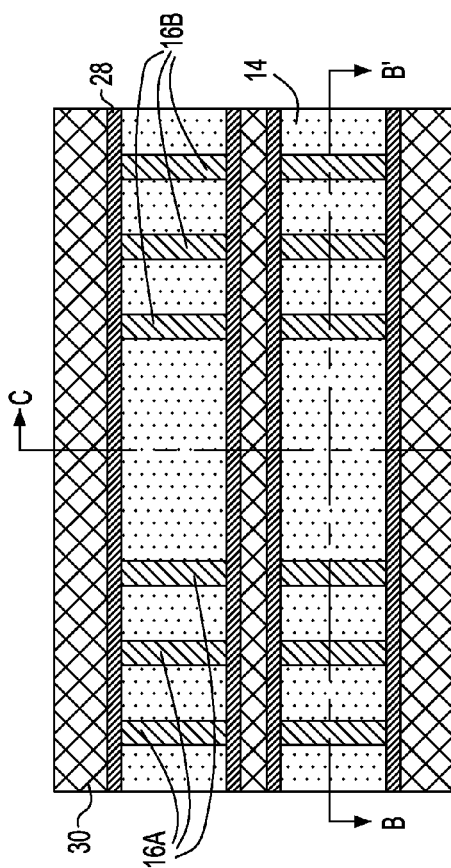
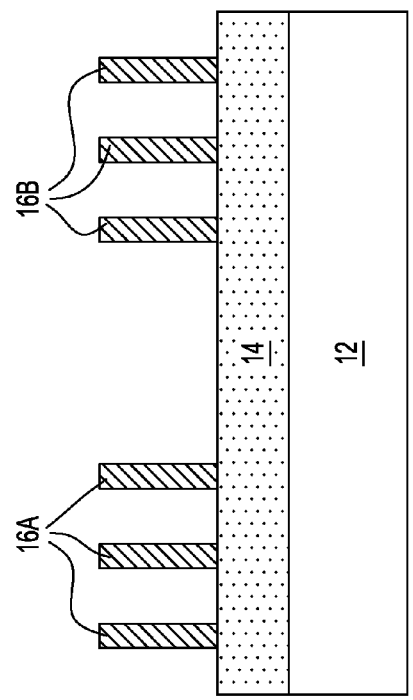
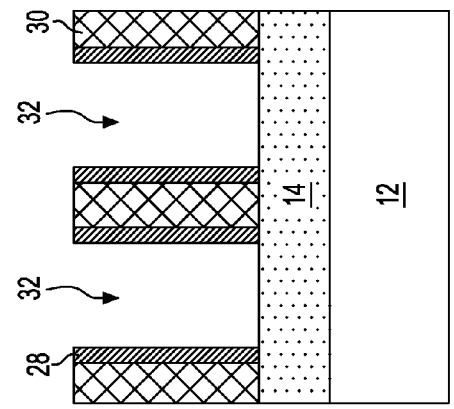

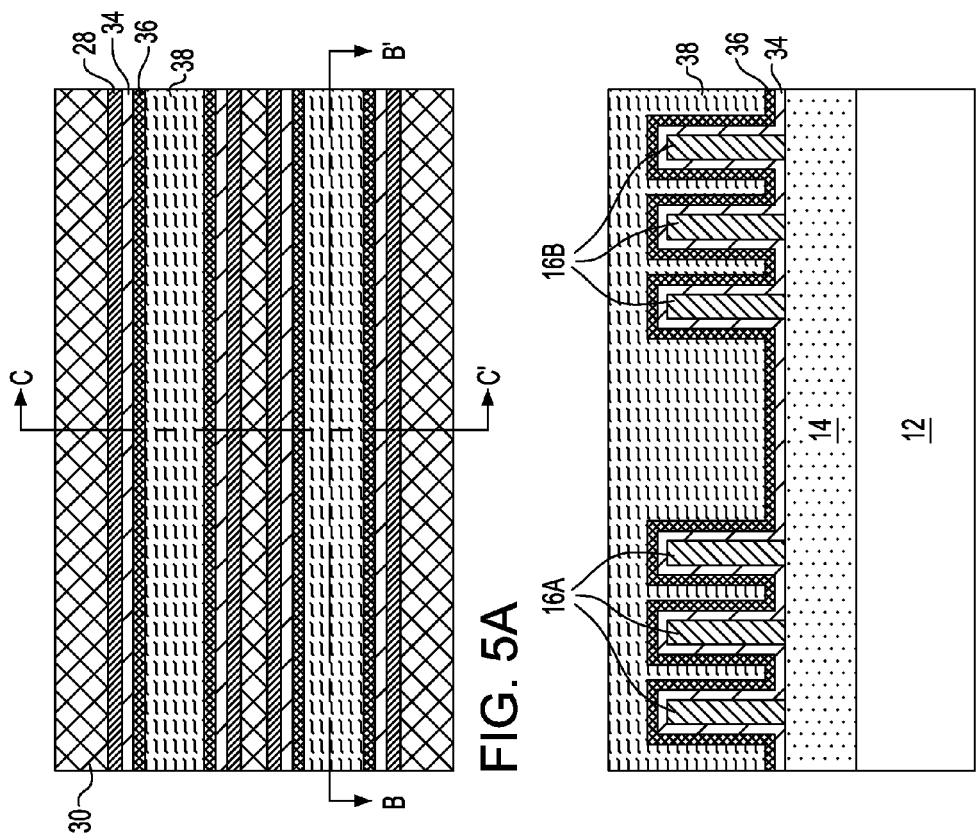

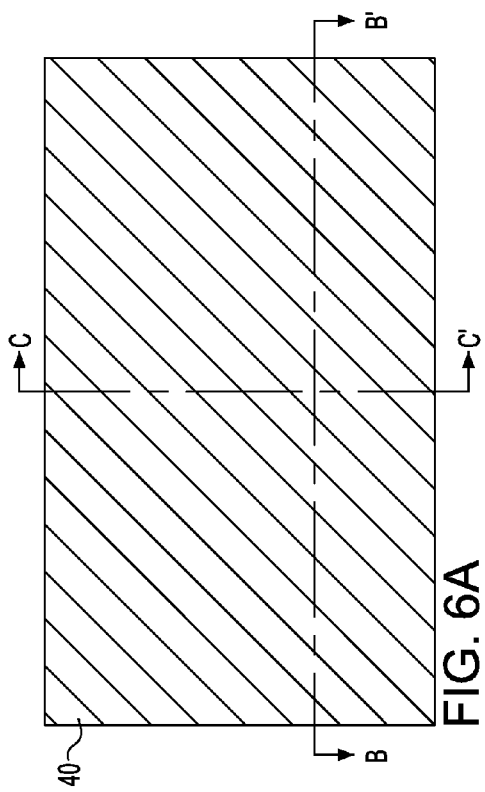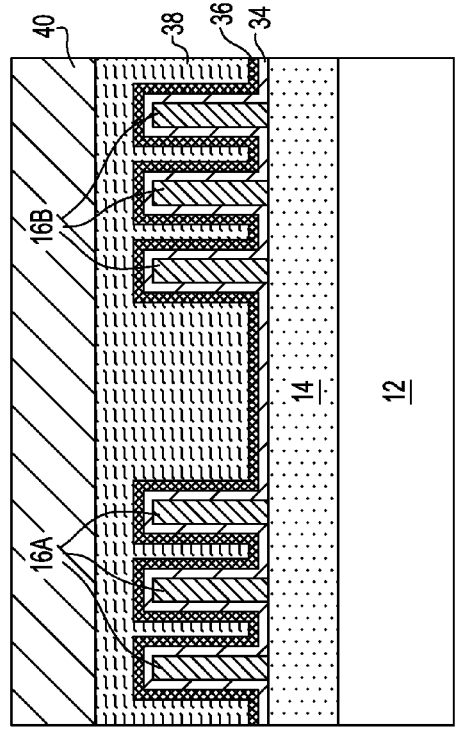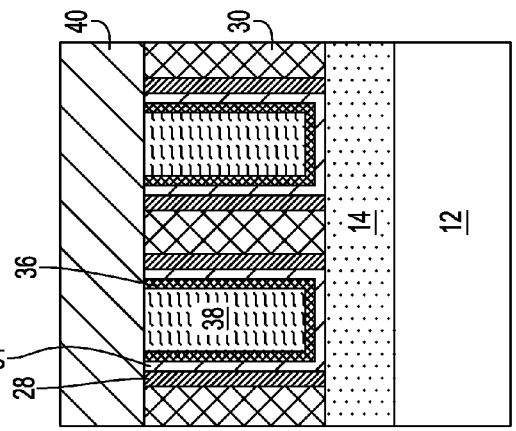

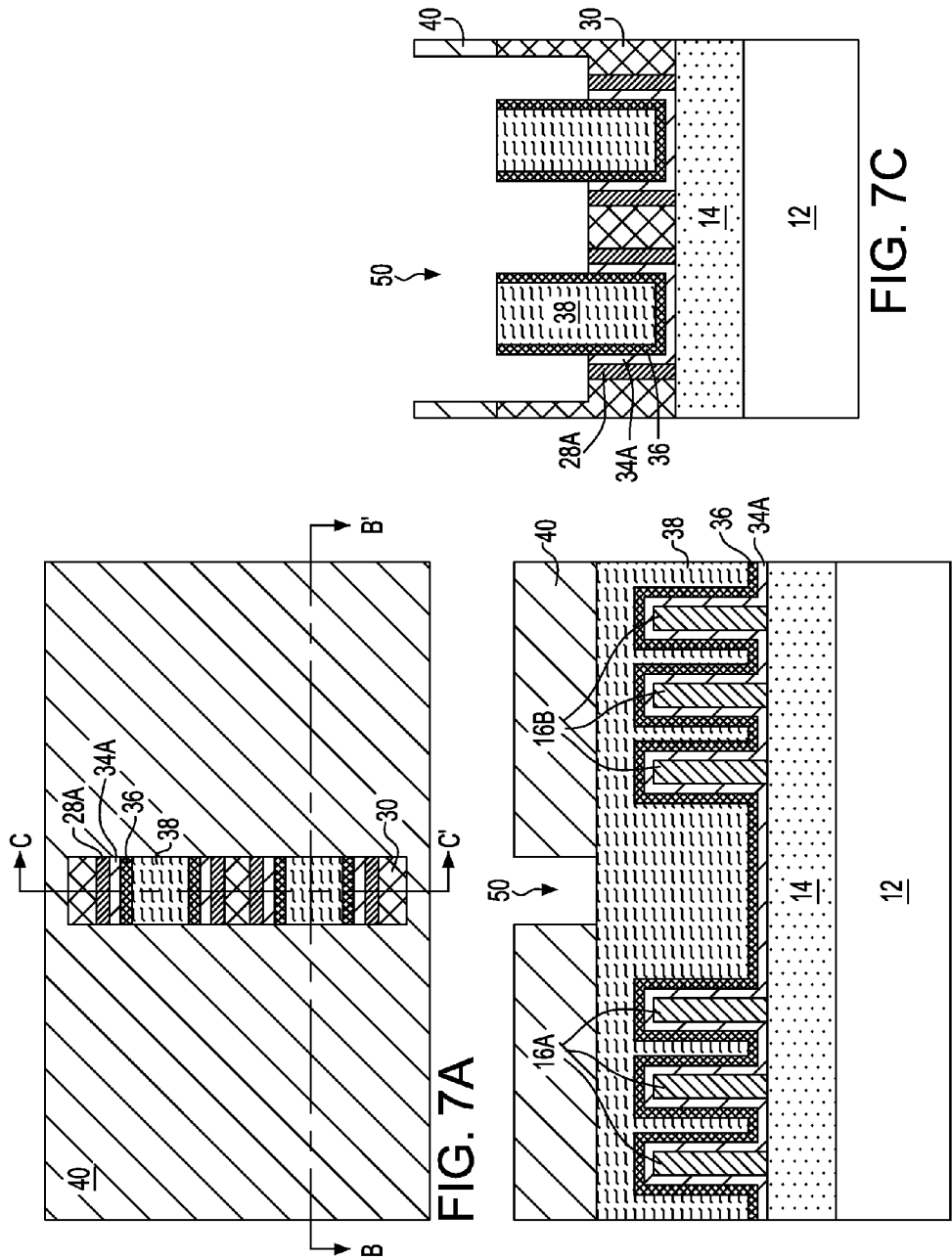

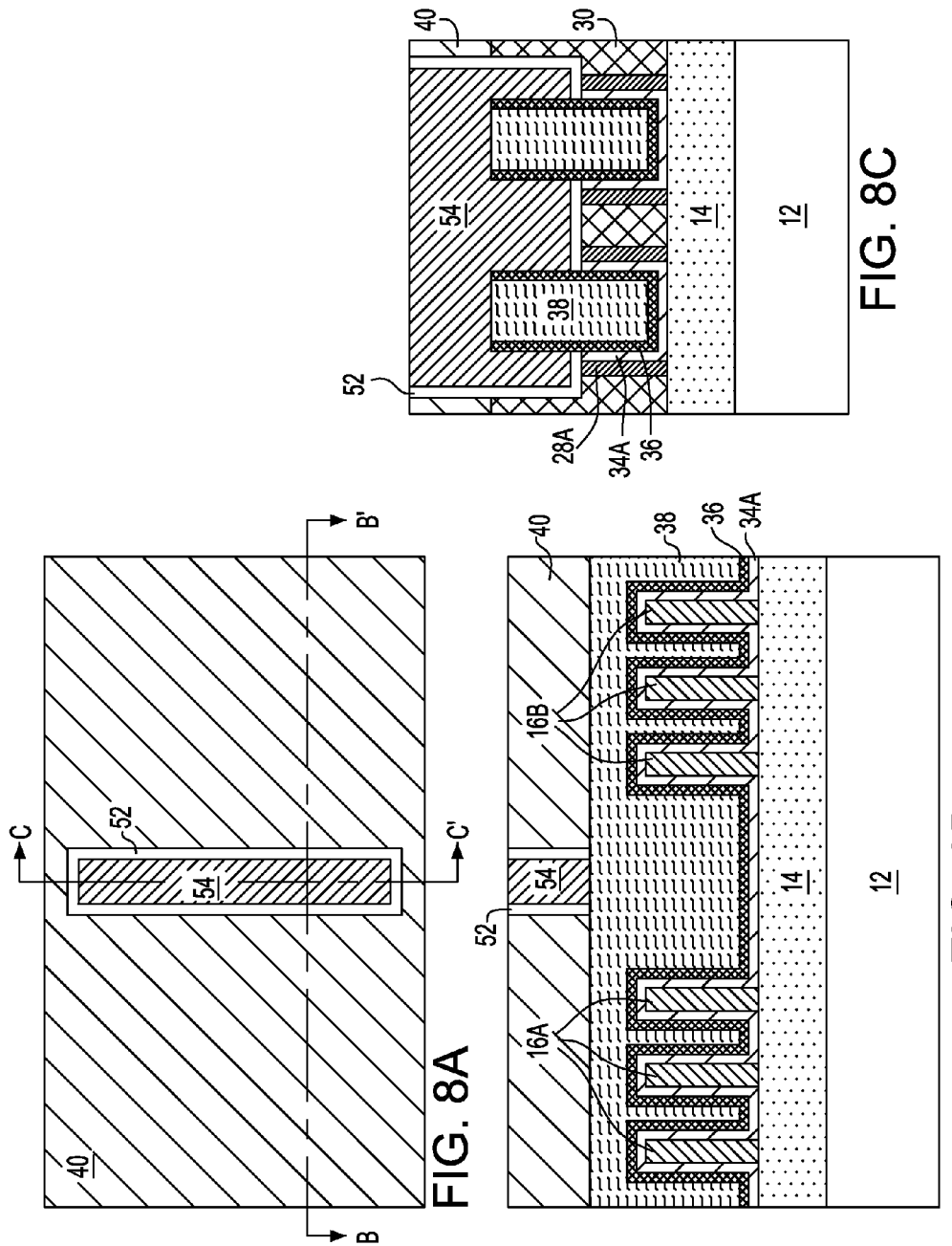

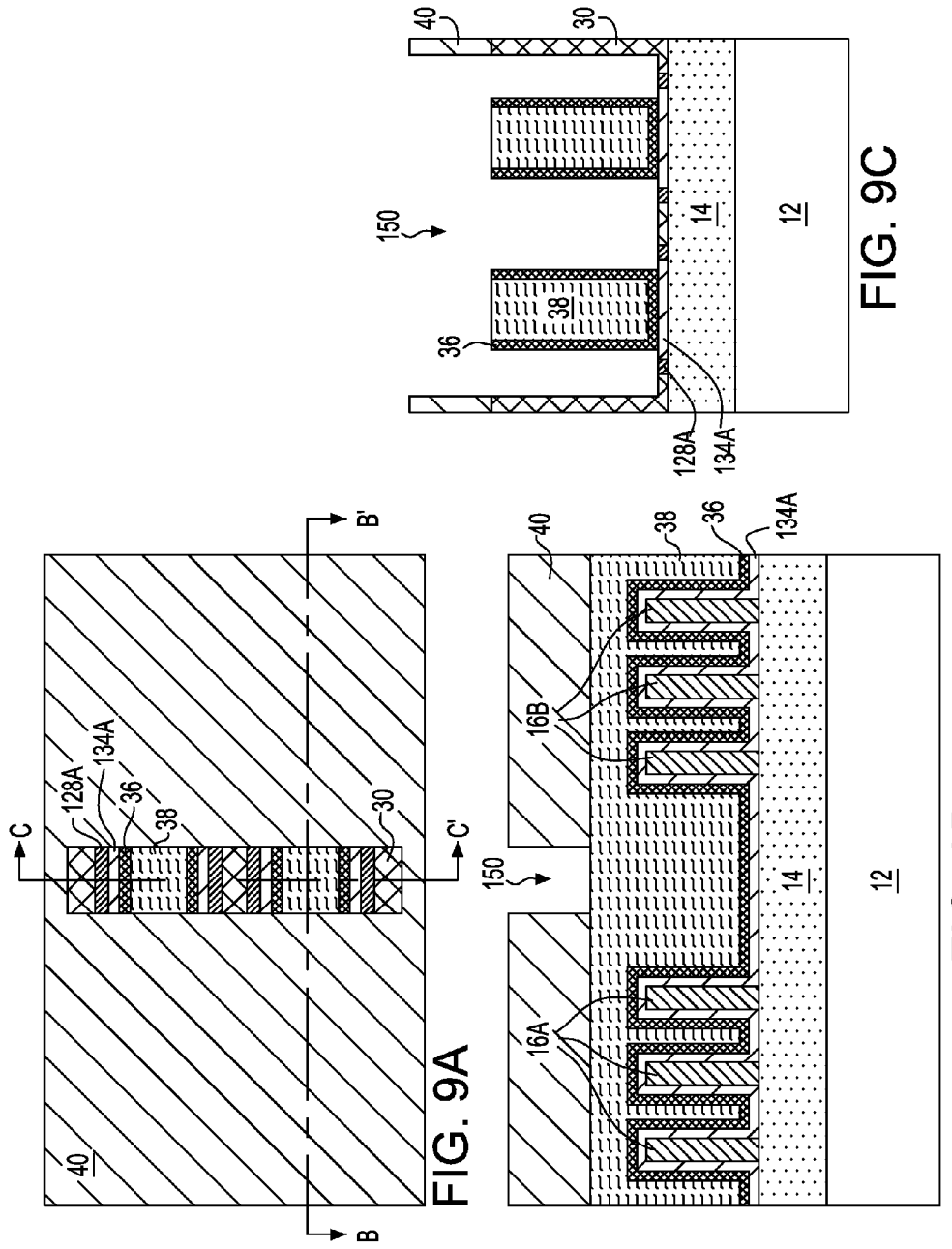

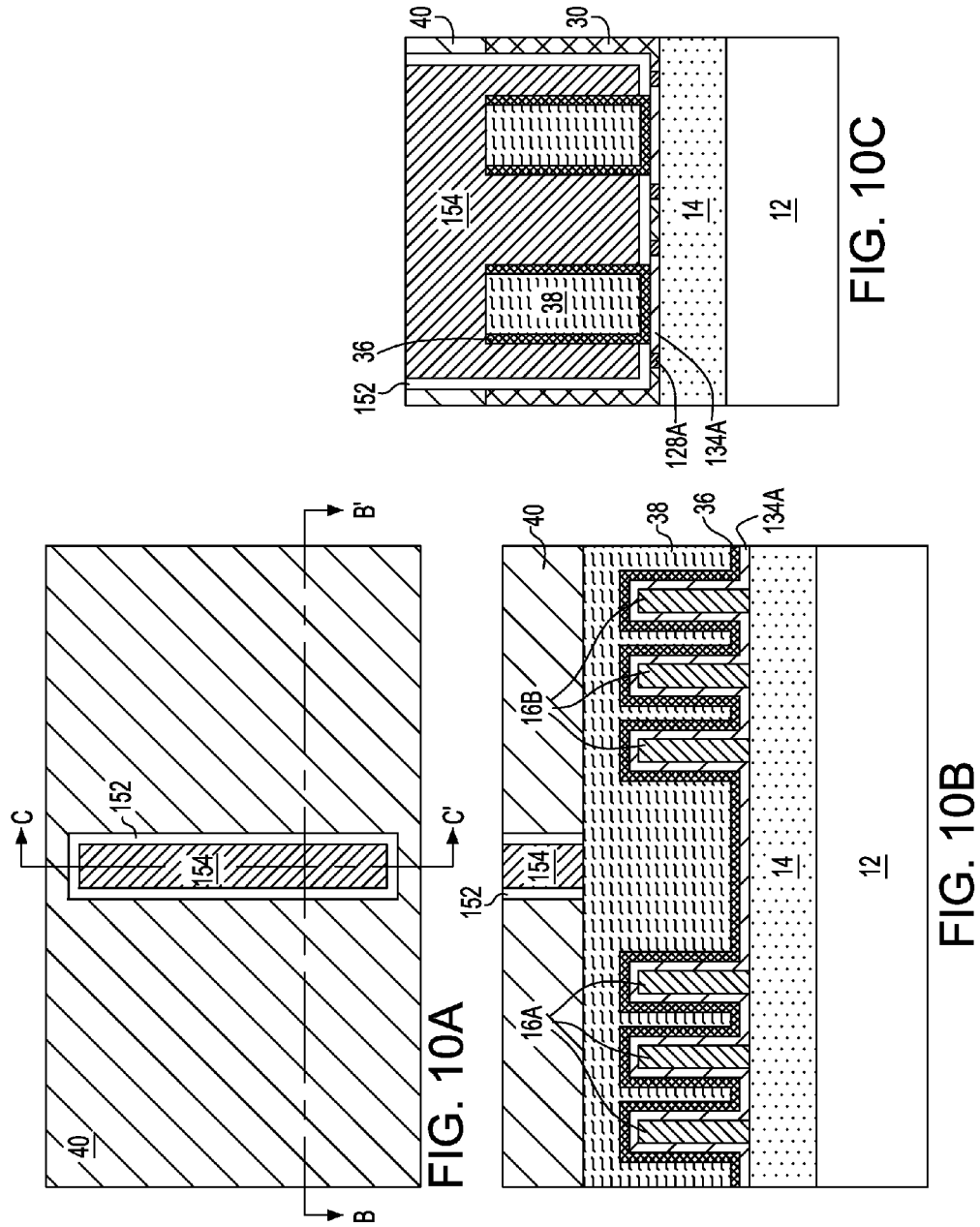

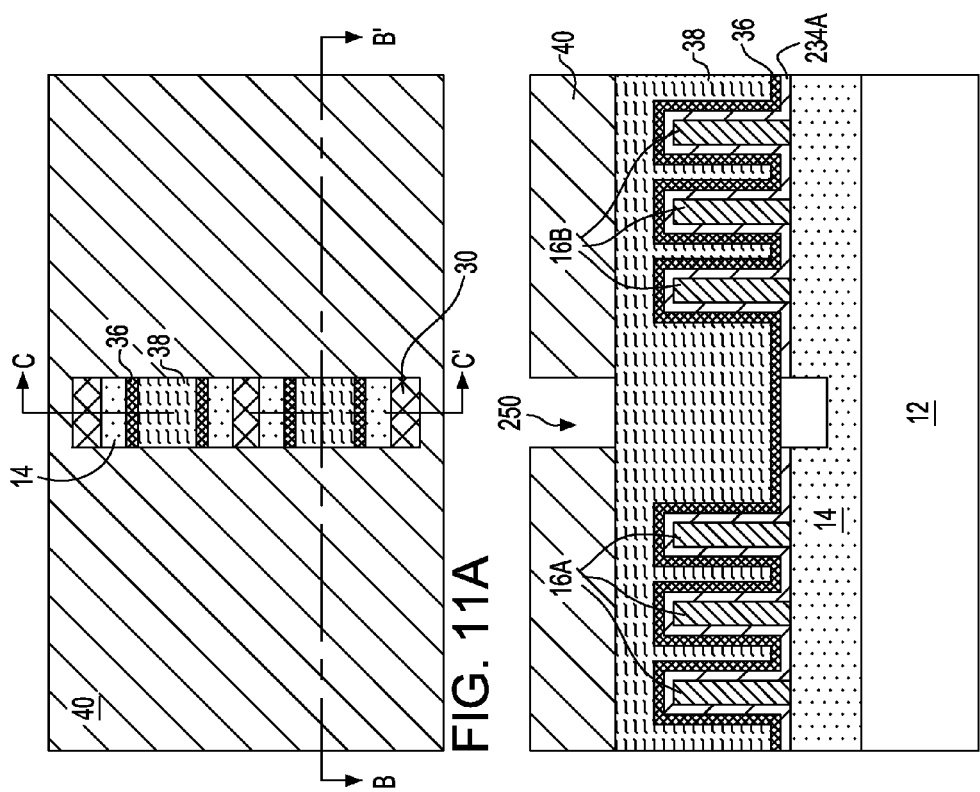

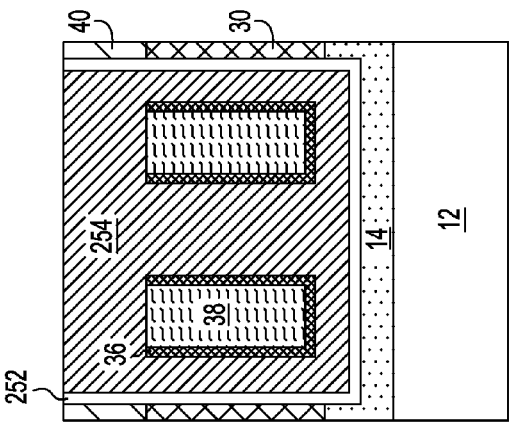
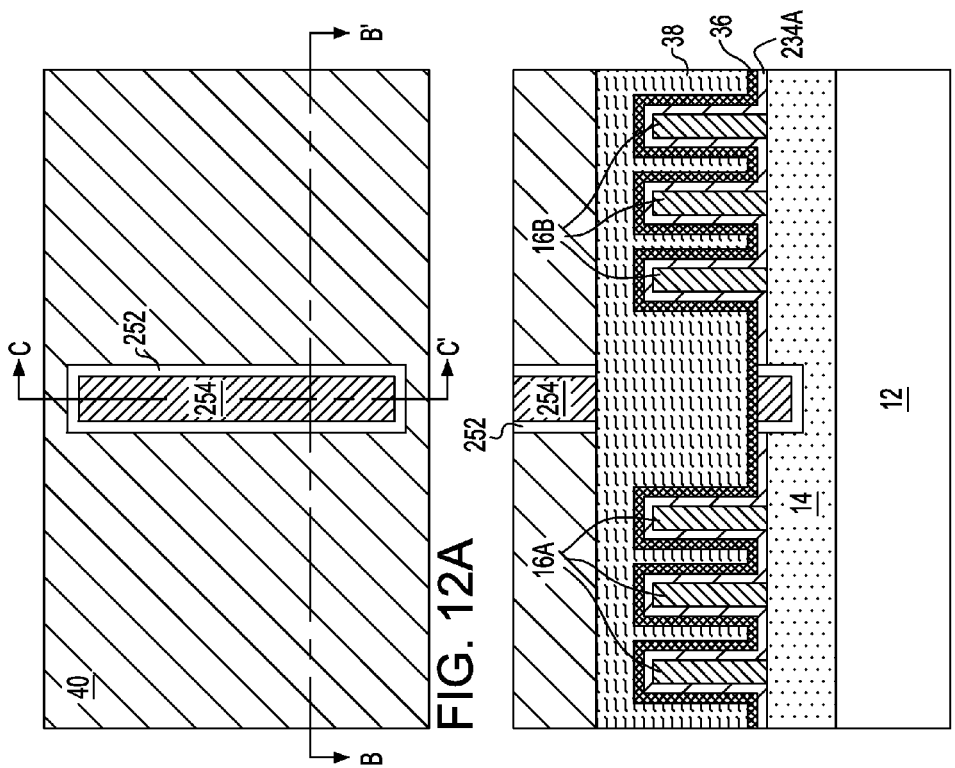

CMOS GATE CONTACT RESISTANCE REDUCTION

BACKGROUND

The present application relates to the fabrication of semiconductor devices, and more particularly, to the formation of gate contacts with reduced contact resistance.

Field Effect Transistors (FETs) are essential components of all modern electronic products. In its basic form, a FET device includes a source, a drain and a channel region between the source and the drain. A gate electrode over the channel region regulates electron flow between the source and the drain. In conventional FET devices, a gate contact typically contacts a top surface of the gate electrode to electrically connect the gate electrode to other active components in integrated circuits. As FET devices are being scaled down, gate electrode dimensions decrease. As a result, the gate contact area may be relatively small. A small gate contact area can lead to high gate contact resistance, which in turn degrades FET frequency response and performance. As such, there remains a need to increase gate contact area.

SUMMARY

The present application provides gate contacts with increased gate contact area by removing at least portions of a gate dielectric portion present on sidewalls of a portion of a gate conductive portion of a gate structure. The gate contact forms a direct contact with a topmost surface and at least portions of outermost sidewalls of the gate conductive portion, thus increasing the contact area between the gate contact and the gate structure. The increased gate contact area reduces gate contact resistance, thus increasing the device performance. The gate contact area of the present application can be further increased by completely surrounding a portion of the gate conductive portion of the gate structure with the gate contact.

In one aspect of the present application, a semiconductor structure is provided. The semiconductor structure includes a substrate comprising a first device region and a second device region separated from one another by an insulating region, and at least one gate structure overlying at least one channel portion of each of the first device region and the second device region. The at least one gate structure comprises a gate spacer, a U-shaped gate dielectric laterally surrounded by the gate spacer, and a gate conductive portion in contact with the U-shaped gate dielectric. The semiconductor structure further includes a gate contact contacting a portion of the at least one gate structure located in the insulating region. The gate contact is in direct contact with a topmost surface and at least portions of outermost sidewalls of the gate conductive portion.

In another aspect of the present application, a method of forming a semiconductor structure is provided. The method includes forming at least one gate structure on a substrate comprising a first device region and a second device region separated from one another by an insulating region. The at least one gate structure overlies at least one channel portion of each of the first device region and the second device region and includes a gate spacer, a U-shaped gate dielectric laterally surrounded by the gate spacer, and a gate conductive portion in contact with the U-shaped gate dielectric. A gate contact trench is then formed through a contact level dielectric layer and at least a portion of an interlevel dielectric (ILD) layer underlying the contact level dielectric layer. The gate contact trench exposes a topmost surface and at least portions of outermost sidewalls of the gate conductive portion in a portion of the at least one gate structure located in the insulating region of the substrate. Next, a gate contact is formed within the gate contact trench. The gate contact is in contact with the topmost surface and the at least portions of the outermost sidewalls of the gate conductive portion located within the gate contact trench.

In yet another aspect of the present application, a method of forming a semiconductor structure is provided. The method includes forming at least one gate structure on a substrate comprising a first device region and a second device region separated from one another by an insulating region. The at least one gate structure overlies at least one channel portion of each of the first device region and the second device region and comprises a gate spacer, a U-shaped gate dielectric laterally surrounded by the gate spacer, and a gate conductive portion in contact with the U-shaped gate dielectric. A gate contact trench is formed through a contact level dielectric layer, an ILD layer and into an upper portion of a buried insulator layer of the substrate located underneath the first device region and the second device region. The buried insulator layer provides the insulating region. The gate contact trench exposes an entirety of a portion of the gate conductive portion of the at least one gate structure located in the insulating region of the substrate. Next, a gate contact is formed within the gate contact trench. The gate contact is in contact with the entirety of the gate conductive portion located within the gate contact trench.

BRIEF DESCRIPTION OF THE DRAWINGS

FIG. 1A is a top view of an exemplary semiconductor structure including an array of first semiconductor fins and an array of second semiconductor fins formed on a substrate in accordance with an embodiment of present application.

FIG. 1B is a cross-sectional view of the exemplary semiconductor structure of FIG. 1A along line B-B'.

FIG. 1C is a cross-sectional view of the exemplary semiconductor structure of FIG. 1A along line C-C'.

FIG. 2A is a top view of the exemplary semiconductor structure of FIGS. 1A-1C after forming sacrificial gate structures over a channel portion of each of the first semiconductor fins and the second semiconductor fins.

FIG. 2B is a cross-sectional view of the exemplary semiconductor structure of FIG. 2A along line B-B'.

FIG. 2C is a cross-sectional view of the exemplary semiconductor structure of FIG. 2A along line C-C'.

FIG. 3A is a top view of the exemplary semiconductor structure of FIGS. 2A-2C after forming an interlevel dielectric (ILD) layer over the substrate to laterally surround the sacrificial gate structures.

FIG. 3B is a cross-sectional view of the exemplary semiconductor structure of FIG. 3A along line B-B'.

FIG. 3C is a cross-sectional view of the exemplary semiconductor structure of FIG. 3A along line C-C'.

FIG. 4A is a top view of the exemplary semiconductor structure of FIGS. 3A-3C after forming gate cavities.

FIG. 4B is a cross-sectional view of the exemplary semiconductor structure of FIG. 4A along line B-B'.

FIG. 4C is a cross-sectional view of the exemplary semiconductor structure of FIG. 4A along line C-C'.

FIG. 5A is a top view of the exemplary semiconductor structure of FIGS. 4A-4C after forming functional gate structures within the gate cavities.

FIG. 5B is a cross-sectional view of the exemplary semiconductor structure of FIG. 5A along line B-B'.

FIG. 5C is a cross-sectional view of the exemplary semiconductor structure of FIG. 5A along line C-C'.

FIG. 6A is a top view of the exemplary semiconductor structure of FIGS. 5A-5C after forming a contact level dielectric over the ILD layer and the functional gate structures.

FIG. 6B is a cross-sectional view of the exemplary semiconductor structure of FIG. 6A along line B-B'.

FIG. 6C is a cross-sectional view of the exemplary semiconductor structure of FIG. 6A along line C-C'.

FIG. 7A is a top view of a first exemplary semiconductor structure that can be derived from the exemplary semiconductor structure of FIGS. 6A-6C after forming a gate contact trench to expose topmost surfaces and portions of outermost sidewalls of a portion of a gate conductive portion in each functional gate structure in accordance with a first embodiment of the present application.

FIG. 7B is a cross-sectional view of the first exemplary semiconductor structure of FIG. 7A along line B-B'.

FIG. 7C is a cross-sectional view of the first exemplary semiconductor structure of FIG. 7A along line C-C'.

FIG. 8A is a top view of the first exemplary semiconductor structure of FIGS. 7A-7C after forming a gate contact within the gate contact trench.

FIG. 8B is a cross-sectional view of the first exemplary semiconductor structure of FIG. 8A along line B-B'.

FIG. 8C is a cross-sectional view of the first exemplary semiconductor structure of FIG. 8A along line C-C'.

FIG. 9A is a top view of a second exemplary semiconductor structure that can be derived from the exemplary semiconductor structure of FIGS. 6A-6C after forming a gate contact trench to expose topmost surfaces and entire outermost sidewalls of a portion of a gate conductive portion in each functional gate structure in accordance with a second embodiment of the present application.

FIG. 9B is a cross-sectional view of the second exemplary semiconductor structure of FIG. 9A along line B-B'.

FIG. 9C is a cross-sectional view of the second exemplary semiconductor structure of FIG. 9A along line C-C'.

FIG. 10A is a top view of the second exemplary semiconductor structure of FIGS. 9A-9C after forming a gate contact within the gate contact trench.

FIG. 10B is a cross-sectional view of the second exemplary semiconductor structure of FIG. 10A along line B-B'.

FIG. 10C is a cross-sectional view of the second exemplary semiconductor structure of FIG. 10A along line C-C'.

FIG. 11A is a top view of a third exemplary semiconductor structure that can be derived from the exemplary semiconductor structure of FIGS. 6A-6C after forming a gate contact trench to expose a portion of an entire gate conductive portion in each functional gate structure in accordance with a third embodiment of the present application.

FIG. 11B is a cross-sectional view of the third exemplary semiconductor structure of FIG. 11A along line B-B'.

FIG. 11C is a cross-sectional view of the third exemplary semiconductor structure of FIG. 9A along line C-C'.

FIG. 12A is a top view of the third exemplary semiconductor structure of FIGS. 11A-11C after forming a gate contact within the gate contact trench.

FIG. 12B is a cross-sectional view of the exemplary semiconductor structure of FIG. 12A along line B-B'.

FIG. 12C is a cross-sectional view of the exemplary semiconductor structure of FIG. 12A along line C-C'.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It should be noted that although the following description and drawings illustrate the basic processing steps employed to form gate contacts with reduced contact resistance in a gate-last processing flow for FinFETs, the basic concept of the present application can also be used in a gate-first processing flow. Furthermore, the basic concept of the present application can be applied to form gate contacts with reduced contact resistance in planar FETs as well.

Referring to FIGS. 1A-1C, there is illustrated an exemplary semiconductor structure that can be employed according to an embodiment of the present application. Specifically, the semiconductor structure includes a substrate having an array of first semiconductor fins 16A formed on a first device region of the substrate and an array of second semiconductor fins 16B formed on a second device region of the substrate. In one embodiment, the first device region can be an n-type FinFET region and the second device region can be a p-type FinFET region.

In one embodiment, the first and the second semiconductor fins 16A, 16B can be formed from a bulk substrate including a bulk semiconductor material throughout (not shown). In another embodiment and as shown in FIG. 1B, the first and the second semiconductor fins 16A, 16B can be formed by patterning a top semiconductor layer of a semiconductor-on-insulator (SOI) substrate. The SOI substrate typically includes, from bottom to top, a handle substrate 12, a buried insulator layer 14 and a top semiconductor layer (not shown) from which the first and the second semiconductor fins 16A, 16B are formed.

The handle substrate 12 may include a semiconductor material which can be Si, Ge, SiGe, SiC, SiGeC, or a III/V compound semiconductor such as, for example, InAs, GaAs, and InP. The handle substrate 12 provides mechanical support to the buried insulator layer 14 and the top semiconductor layer. The thickness of the handle substrate 12 can be from 30 μm to about 2 mm, although lesser and greater thicknesses can also be employed.

The buried insulator layer 14 may include a dielectric material which can be silicon oxide, silicon nitride, silicon oxynitride, or a combination thereof. The thickness of the buried insulator layer 14 can be from 50 nm to 200 nm, although lesser and greater thicknesses can also be employed.

The top semiconductor layer may include a semiconductor material which can be Si, Ge, SiGe, SiC, SiGeC, or a III/V compound semiconductor such as, for example, InAs, GaAs, and InP. The semiconductor materials of the top semiconductor layer and the handle substrate 12 may be same or different. Typically, each of the handle substrate 12 and the top semiconductor layer comprises a single crystalline semiconductor material, such as, for example, single crystalline silicon. The top semiconductor layer may or may not be doped with p-type dopants and/or n-type dopants. Examples of p-type dopants include, but are not limited to, boron, aluminum, gallium and indium. Examples of n-type dopants, include but are not limited to, antimony, arsenic and phosphorous. The thickness of the top semiconductor layer can be from 10 nm to 200 nm, although lesser and greater thicknesses can also be employed.

Optionally, a pad layer which may be comprised of silicon nitride or a stack of a silicon nitride layer and an underlying silicon oxide layer can be deposited on the top semiconductor layer. The pad layer, when present, protects the top semiconductor layer during the subsequent patterning processes.

In one embodiment, the first and the second semiconductor fins 16A, 16B can be formed by lithography and etching. The lithographic step includes applying a photoresist layer (not shown) atop the top semiconductor layer (or the pad layer, if present), exposing the photoresist layer to a desired pattern of radiation, and developing the exposed photoresist layer utilizing a conventional resist developer. The etching process may be a dry etch and/or a wet chemical etch. Illustrative examples of suitable dry etching processes that can be used in the present application include reactive ion etch (RIE), ion beam etching, plasma etching or laser ablation. Typically, a RIE process is used. The etching process transfers the pattern from the patterned photoresist layer to the top semiconductor layer or first to the pad layer, if present, and thereafter to the underlying top semiconductor layer to provide the first and the second semiconductor fins 16A, 16B utilizing the buried insulator layer 14 as an etch stop. After forming the first and the second semiconductor fins, the patterned photoresist layer can be removed utilizing a conventional resist stripping process such as, for example, ashing. Alternatively, the semiconductor fins 16A, 16B can also be formed utilizing a sidewall image transfer (SIT) process. In a typical SIT process, spacers are formed on sacrificial mandrels. The sacrificial mandrels are removed and the remaining spacers are used as an etch mask to etch the top semiconductor layer. The spacers are then removed after the semiconductor fins 16A, 16B have been formed.

In one embodiment of the present application, the first and the second semiconductor fins 16A, 16B are formed substantially parallel to each other. The height of each of the first and the second semiconductor fin 16A, 16B that is formed can be from 5 nm to 300 nm, although lesser or greater heights can also be employed. The width of each of the first and the second semiconductor fin 16A, 16B can be in a range from 5 nm to 50 nm, although lesser or greater widths can also be employed. The first and the second semiconductor fins 16A, 16B in each array may have a pitch ranging from 20 nm to 100 nm, with a pitch ranging from 30 nm to 50 nm being more typical.

In some embodiments of the present application and when the pad layer is present, the pad layer that remains atop the first and the second semiconductor fins 16A, 16B can be removed at this stage. The removal of the remaining non-etched portion of pad layer can be achieved by performing a selective etching process or by utilizing a planarization process such as chemical mechanical planarization (CMP). In some embodiments, a portion of the pad layer can remain atop each of the first and the second semiconductor fins 16A, 16B.

Referring to FIGS. 2A-2C, at least one gate structure is formed over a channel portion of each of the first and the second semiconductor fins 16A, 16B. In one embodiment and as shown in FIGS. 2A and 2B, the at least one gate structure includes a pair of sacrificial gate structures that are subsequently replaced as described below. The sacrificial gate structures are aligned substantially parallel to one another and straddles the first and the second semiconductor fins 16A, 16B.

Each sacrificial gate structure includes a sacrificial gate stack and a gate spacer 28 formed on each sidewall of the sacrificial gate stack. Each sacrificial gate stack includes, from bottom to top, a sacrificial gate dielectric 22, a sacrificial gate conductor 24 and a sacrificial gate cap 26. The sacrificial gate stack (22, 24, 26) can be formed by first providing a material stack (not shown) that includes, from bottom to top, a sacrificial gate dielectric layer, a sacrificial gate conductor layer and a sacrificial gate cap layer over the first and the second semiconductor fins 16A, 16B and the buried insulator layer 14. In some embodiments of the present application, the sacrificial gate dielectric layer can be omitted. When present, the sacrificial gate dielectric layer includes a dielectric material such as an oxide or a nitride. In one embodiment, the sacrificial gate dielectric layer may include silicon oxide, silicon nitride, or silicon oxynitride. The sacrificial gate dielectric layer can be formed by a conventional deposition process, including but not limited to, chemical vapor deposition (CVD) or physical vapor deposition (PVD). The sacrificial gate dielectric layer can also be formed by conversion of a surface portion of the first and the second semiconductor fins 16A, 16B. The sacrificial gate dielectric layer that is formed may have a thickness from 1 nm to 10 nm, although lesser and greater thicknesses can also be employed.

The sacrificial gate conductor layer may include a semiconductor material such as polysilicon or a silicon-containing semiconductor alloy such as a silicon-germanium alloy. The sacrificial gate conductor layer can be formed using CVD or plasma enhanced chemical vapor deposition (PECVD). The sacrificial gate conductor layer that is formed may have a thickness from 20 nm to 300 nm, although lesser and greater thicknesses can also be employed.

The sacrificial gate cap layer may include a dielectric material such as an oxide, a nitride or an oxynitride. In one embodiment, the sacrificial gate cap layer is comprised of silicon nitride. The sacrificial gate cap layer can be formed utilizing a conventional deposition process including, for example, CVD and PECVD. The sacrificial gate cap layer that is formed may have a thickness from 10 nm to 200 nm, although lesser and greater thicknesses can also be employed.

The material stack can then be patterned by lithography and etching to form the sacrificial gate stack (22. 24, 26). Specifically, a photoresist layer (not shown) is applied over the topmost surface of the material stack and is lithographically patterned by lithographic exposure and development. The pattern in the photoresist layer is transferred into the material stack by an etch, which can be an anisotropic etch such as RIE. The remaining portions of the material stack after the pattern transfer constitute the sacrificial gate stack (22, 24, 26). The patterned photoresist layer may be subsequently removed by, for example, ashing.

The gate spacer 28 may include a dielectric material such as, for example, an oxide, a nitride, an oxynitride, or any combination thereof. For example, the gate spacer 28 may be composed of silicon nitride, silicon boron carbon nitride, or silicon carbon oxynitride. The gate spacer 28 can be formed by first providing a conformal gate spacer material layer (not shown) on exposed surfaces of the sacrificial gate stacks (22, 24, 26) and the buried insulator layer 14 and then etching the conformal gate spacer material layer to remove horizontal portions of the conformal gate spacer material layer. The conformal gate spacer material layer can be provided by a deposition process including, for example, CVD, PECVD, or PVD. The etching of the conformal gate spacer material layer may be performed by a dry etch process such as, for example, RIE. The remaining portions of the conformal gate spacer material layer constitute the gate spacer(s) 28. The width of each gate spacer 28, as measured at the base of the gate spacer 28 can be from 5 nm to 100 nm, although lesser and greater widths can also be employed.

After the sacrificial gate structures (22, 24, 26, 28) are formed, a first source region and a first drain region (collectively referred to as first source/drain regions) (not shown) may be formed on opposite sides of each of the sacrificial gate structures (22, 24, 26, 28) in the first device region of the substrate, while a second source region and a second drain region (collectively referred to as second source/drain regions) (not shown) may be formed on opposite sides of each of the sacrificial gate structures (22, 24, 26, 28) in the second device region of the substrate.

In one embodiment of the present application, the first and second source/drain regions are planar source/drain regions located within the first and second semiconductor fins 16A, 16B, respectively. The planar source/drain regions can be formed utilizing ion implantation. For n-type FinFETs, the source/drain regions can be made by implanting an n-type dopant, while for p-type FinFETs, the source/drain regions can be made by implanting a p-type dopant. Exemplary n-type dopants include, but are not limited to, P, As or Sb. Exemplary p-type dopants include, but are not limited to, B, Al, Ga or In. An activation anneal can be subsequently performed to activate the implanted dopants in the source/drain regions.

In another embodiment of the present application, the first and second source/drain regions are raised source/drain regions located on top and sidewall surfaces of the first and second semiconductor fins 16A, 16B, respectively. The raised source/drain regions may be formed by selective epitaxy. During the selective epitaxy process, the deposited semiconductor material grows only on exposed semiconductor surfaces, i.e., exposed surfaces of the first and the second semiconductor fins 16A, 16B on opposite sides of the sacrificial gate structures (22, 24, 26, 28) and does not grow on dielectric surfaces, such as surfaces of the sacrificial gate cap 26, the gate spacer 28 and the buried insulator layer 14.

The semiconductor material of the raised source/drain regions can be deposited as an intrinsic semiconductor material, or can be deposited with in-situ doping. If the semiconductor material is deposited as an intrinsic semiconductor material, the raised source/drain regions can be subsequently doped (ex-situ) utilizing ion implantation, gas phase doping or dopant out diffusion from a sacrificial dopant source material. In one embodiment, the semiconductor material for n-type FinFETs may include Si:C, while the semiconductor material for p-type FinFETs may include SiGe.

Referring to FIGS. 3A-3C, an interlevel dielectric (ILD) layer 30 is formed over the substrate to laterally surround the sacrificial gate structures (22, 24, 26, 28). The ILD layer 30 may include a dielectric material such as undoped silicon oxide, doped silicon oxide, silicon nitride, porous or non-porous organosilicate glass, porous or non-porous nitrogen-doped organosilicate glass, or a combination thereof. The ILD layer 30 can be formed by CVD, PVD or spin coating. The thickness of the ILD layer 30 can be selected so that an entirety of the top surface of the ILD layer 30 is formed above top surfaces of the sacrificial gate cap 26. The ILD layer 30 can be subsequently planarized, for example, by CMP and/or a recess etch using the sacrificial gate cap 26 as an etch stop. After the planarization, the ILD layer 30 has a top surface coplanar with the top surfaces of the sacrificial gate cap 26.

Referring to FIGS. 4A-4C, the sacrificial gate stacks (22, 24, 26) in the sacrificial gate structures (22, 24, 26, 28) are removed to provide gate cavities 32. The sacrificial gate stacks (22, 24, 26) can be removed selectively to the buried insulator layer 14, the first and the second semiconductor fins 16A, 16B, the gate spacers 28 and the ILD layer 30 by at least one etch, which can be a dry etch and/or a wet chemical etch. Each of the gate cavities 32 occupies a volume from which a corresponding sacrificial gate stack (22, 24, 26) is removed and is laterally confined by inner sidewalls of the gate spacers 28.

Referring to FIGS. 5A-5C, functional gate stacks are formed in the gate cavities 32. Each functional gate stack includes a gate dielectric 34, a work function metal 36, and a gate electrode 38. As shown, the gate dielectric 34 and the work function metal layer portion 36 are both U-shaped. Each functional gate stack (34, 36, 38) and the gate spacer 28 present on sidewalls of the functional gate stack (34, 36, 38) constitute a functional gate structure (34, 36, 38, 28). The work function metal 36 and the gate electrode 38 in each functional gate structure (34, 36, 38, 28) are collectively referred to as the gate conductive portion (36, 38), while the gate spacer 28 and the gate dielectric 34 are collectively referred to as the gate dielectric portion (28, 34). In some embodiment of the present application, the work function metal 36 can be omitted.

The functional gate stacks (34, 36, 38) can be formed by first depositing a conformal gate dielectric layer (not shown) on the bottom surfaces and sidewalls of the gate cavities 32 and the topmost surface of the ILD layer 30. The gate dielectric layer may be a high dielectric constant (high-k) material layer having a dielectric constant greater than 8.0. Exemplary high-k materials include, but are not limited to, $HfO_2$, $ZrO_2$, $La_2O_3$, $Al_2O_3$, $TiO_2$, $SrTiO_3$, $LaAlO_3$, $Y2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. The gate dielectric layer can be formed by a conventional deposition process, such as, for example, CVD, PVD, or atomic layer deposition (ALD). The gate dielectric layer that is formed may have a thickness ranging from 0.9 nm to 6 nm, with a thickness ranging from 1.0 nm to 3 nm being more typical. The gate dielectric layer may have an effective oxide thickness on the order of or less than 1 nm.

Subsequently, a first work function metal layer portion (not shown) is formed over a portion of the gate dielectric layer in the first device region of the substrate (e.g., n-type FinFET region), while a second work function metal layer portion (not shown) is formed over another portion of the gate dielectric layer in the second device region of the substrate (e.g., p-type FinFET region).

The first work function metal layer portion can be formed by depositing a conformal first work function material layer (not shown) over the gate dielectric layer and the ILD layer 30 by, for example, CVD, PVD, or ALD. The first work function metal layer may include a first metal selected to optimize the performance of n-type FinFETs to be subsequently formed. In one embodiment, the first work function metal layer may include La, Ti, Ta or TiAl. The thickness of the work function metal layer can be from 3 nm to 15 nm, although lesser and greater thicknesses can also be employed. A portion of the first work function metal layer is removed from the second device region of the substrate by conventional lithography and etching processes to expose a portion of the gate dielectric layer in the second device region. The remaining portion of the first work function metal layer constitutes the first work function metal layer portion.

A conformal second work function metal layer (not shown) is then formed over the exposed portion of the gate dielectric layer, the first work function metal layer portion and the ILD layer 30 by, for example, CVD, PVD, or ALD. The second work function metal layer may include a second metal selected to optimize the performance of p-type FinFETs to be subsequently formed. In one embodiment, the first work function metal layer may include Pt, Ni, Co or TiN. The thickness of the work function metal layer can be from 3 nm to 15 nm, although lesser and greater thicknesses can also be employed. In one embodiment, a portion of the second work function metal layer that is formed on the first work function metal layer portion is removed by conventional lithography and etching processes to re-expose the first work function metal layer portion. The remaining portion of the second work function metal layer constitutes the second work function metal layer portion. In another embodiment of the present application, the step of the removal of the second work function metal layer from the first work function metal layer portion can be omitted.

A gate electrode material layer (not shown) is formed over the first and the second work function metal layer portions if a portion of the second work function metal layer is removed from the first function metal layer portion and the ILD layer to completely fill the gate cavities 32. The gate electrode material layer may include any conductive material including, for example, doped polysilicon, Al, Au, Ag, Cu or W. The gate electrode material layer can be formed by a conventional deposition process such as, for example, CVD, PVD or ALD.

Portions of the gate electrode material layer, the first work function metal layer portion, the second work function metal layer portion and the gate dielectric layer that are located above the top surface of the ILD layer 30 are removed by employing a planarization process, such as, for example, CMP. A remaining portion of the gate dielectric layer in each gate cavity 32 constitutes a gate dielectric 34. A remaining portion of the first work function metal layer portion in each gate cavity 32 constitutes a first work function metal, while a remaining portion of the second work function metal layer portion in each gate cavity 32 constitutes a second work function metal. The first work function metal and the second work function metal in each gate cavity 32 are herein collectively referred to as the work function metal 36. A remaining portion of the gate electrode material layer in each cavity 32 constitutes a gate electrode 38. Topmost surfaces of the gate dielectric 34, the work function metal 36 and the gate electrode 38 in each gate cavity 32 are coplanar with the top surface of the ILD layer 30.

Referring to FIGS. 6A-6C, a contact level dielectric layer 40 is deposited over the ILD layer 30 and the functional gate structures (34, 36, 38, 28). The contact level dielectric layer 40 may include a dielectric material such as undoped silicon oxide, doped silicon oxide, porous or non-porous organosilicate glass, porous or non-porous nitrogen-doped organosilicate glass, or a combination thereof. In some embodiments, the contact level dielectric layer 40 may include a same dielectric material as that used in the ILD layer 30. In other embodiments, the contact level dielectric layer 40 may include a different dielectric material from that used in the ILD layer 30. The contact level dielectric layer 40 can be formed by CVD, PVD or spin coating. If the contact level dielectric layer 40 is not self-planarizing, the top surface of the contact level dielectric layer 40 can be planarized, for example, by CMP. The planarized top surface of the contact level dielectric layer 40 is located above the topmost surfaces of the functional gate structures (34, 36, 38, 28).

FIGS. 7A-7C and 8A-8C are various top and cross-section views illustrating steps for forming a first exemplary gate contact with reduced contact resistance from the exemplary semiconductor structure of FIGS. 6A-6C in accordance with a first embodiment of the present application.

Referring to FIGS. 7A-7C, a gate contact trench 50 is formed extending through the contact level dielectric layer 40 and a portion of the ILD layer 30 to expose a portion of each functional gate structure (34, 36, 38, 28) located in the non-device regions of the substrate. In one embodiment and as shown in FIG. 7B, the exposed portions of the functional gate structures (34, 36, 38, 28) are located between the array of the first semiconductor fins 16A and the array of the second semiconductor fins 16B. The gate contact trench 50 exposes the topmost surfaces and portions of the outermost sidewalls of the gate conductive portion (36, 38) in each of the functional gate structures (34, 36, 38, 28).

The gate contact trench 50 can be formed by applying a mask layer (not shown) over the contact level dielectric layer 40, and then lithographically patterning the mask layer to form an opening therein. The opening overlies a portion of each of the functional gate structures (34, 36, 38, 28) located between the array of the first semiconductor fins 16A and the array of the second semiconductor fins 16B, and portions of the ILD layer 30 adjoined the functional gate structures (34, 36, 38, 28). The mask layer can be a photoresist layer or a photoresist layer in conjunction with hardmask layer(s). A portion of the contact level dielectric layer 40 exposed by the opening and portions of the ILD layer 30, the gate spacer 28 and the gate dielectric 34 underlying the exposed portion of the contact level dielectric layer 40 are removed by an anisotropic etch, such as, for example, RIE to form the gate contact trench 50. In one embodiment, the anisotropic etch is selected to remove the dielectric materials of the contact level dielectric layer 40, the ILD layer 30, the gate spacer 28 and the gate dielectric 34 selective to the conductive materials of the work function metal 36 and the gate electrode 38. The remaining portions of the gate spacer 28 are herein referred to as gate spacer portions 28A. The remaining portions of the gate dielectric 34 are herein referred to as gate dielectric portions 34A. In one embodiment and as shown in FIG. 7C, portions of the gate spacer 28 and the gate dielectric 34 that are not covered by the gate conductive portion (36, 38) of each functional gate structure (34, 36, 38, 28) are partially removed. The topmost surfaces of the gate spacer portions 28A and the gate dielectric portions 34A are thus located between the topmost surfaces of the gate conductive portions (36, 38) of the functional gate structures (34, 36, 38, 28) (i.e., the top surface of the gate electrode 38) and the bottommost surfaces of the gate conductive portions (36, 38) of the functional gate structures (34, 36, 38, 28) (i.e., the bottommost surface of the work function metal 36). The partial removal of the gate spacer 28 and the gate dielectric 34 exposes the topmost surfaces and portions of the outermost sidewalls of the gate conductive portion (36, 38) in each functional gate structure (34, 36, 38, 28). After forming the gate contact trench 50, the remaining mask layer can be removed by oxygen-based plasma etching.

In some embodiments of the present application and when the gate dielectric 34 is composed of a high-k dielectric material, after forming the gate contact trench 50, an optional plasma nitridation may be performed to nitridize portions of the gate dielectric portions 34A exposed on sidewalls of the gate contact trench 50 (not shown). The nitridation encapsulates exposed portions of the gate dielectric portions 34A to prevent oxygen ingress into the gate dielectric portions 34A.

Referring to FIGS. 8A-8C, a gate contact is formed within the gate contact trench 50. The gate contact includes a contact liner 52 formed on sidewalls and a bottom surface of the gate contact trench 50 and a contact plug 54 formed over the contact liner 52 filling the gate contact trench 50. The gate contact (52, 54) extends through the contact level dielectric layer 40 and a portion of the ILD layer 30 to laterally surround an upper portion of the gate conductive portion (36, 38) of each functional gate structure (34, 36, 38, 28). The gate contact (52, 54) thus directly contacts the topmost surfaces and portions of outermost sidewalls of the gate conductive portion (36, 38) of each functional gate structure (34, 36, 38, 28).

The gate contact (52, 54) may be formed by first forming a conformal contact liner material layer (not shown) on the sidewalls and the bottom surface of the gate contact trench 50 and the top surface of the contact level dielectric layer 40. The contact liner material layer may include titanium, titanium nitride, tantalum, tantalum nitride, nickel, platinum, cobalt, tungsten, rhenium, palladium, erbium, hafnium, lanthanum or their alloys and may be formed utilizing a conformal deposition process including CVD or ALD. The contact liner material layer that is formed can have a thickness ranging from 1 nm to 5 nm, although lesser and greater thicknesses can also be employed.

A contact material layer (not shown) is deposited in the remaining volumes of the gate contact trench 50 to completely fill the gate contact trench 50. The contact material layer may include a metal such as, for example, tungsten, aluminum, copper or their alloys. The contact material layer can be formed by any suitable deposition method such as, for example, CVD, PVD or plating.

Portions of the contact liner material layer and the contact material layer that are located above the top surface of the contact level dielectric layer 40 can be subsequently removed by employing a planarization process, such as, for example, CMP. The remaining portion of the contact liner material layer in the gate contact trench 50 constitutes a contact liner 52. The remaining portion of the contact material layer in the gate contact trench 50 constitutes a contact plug 54.

In the first embodiment of the present application, in addition to contacting the topmost surfaces of the gate conductive portion (36, 38) of each functional gate structure (34, 36, 38, 28), the gate contact (52, 54) directly contacts portions of outermost sidewalls of the gate conductive portion (36, 38), thus increasing contact area between the gate contact (52, 54) and the functional gate structures (34, 36, 38, 28). The increased contact area of the present application reduces gate contact resistance, which in turn can enhance the device performance.

FIGS. 9A-9C and 10A-10C are various top and cross-section views illustrating steps for forming a second exemplary gate contact with reduced contact resistance from the exemplary semiconductor structure of FIGS. 6A-6C in accordance with a second embodiment of the present application.

Referring to FIGS. 9A-9C, a gate contact trench 150 can be derived from the exemplary semiconductor structure of FIGS. 6A-6C by altering the process for the anisotropic etch at the processing steps of FIGS. 7A-7C. The anisotropic etch that is employed to recess the gate spacer 28 and the gate dielectric 34 in FIGS. 7A-7C is continued until portions of gate spacer 28 and the gate dielectric 34 that are present on the outermost sidewalls of the gate conductive portion (36, 38) of each functional gate structure (34, 36, 38, 28) are completely removed. The entire outermost sidewalls of the gate conductive portion (36, 38) of each functional gate structure (34, 36, 38, 28) are thus exposed in the gate contact trench 150. The remaining portions of the gate spacer 28 have top surfaces coplanar with the top surfaces of the horizontal portions of the gate dielectric 34. The remaining portions of the gate spacer 28 are herein referred to as the gate spacer portions 128A. The remaining portions of the gate dielectric 34 (i.e., horizontal portions of the gate dielectric 34) are herein referred to the gate dielectric portions 134A.

Referring to FIGS. 10A-10C, a gate contact (152, 154) is formed within the gate contact trench 150 utilizing the same processing steps described above with respect to FIGS. 8A-AC. The gate contact (152, 154) extends through the contact level dielectric layer 40 and into the ILD layer 30 and laterally surrounds an entirety of the gate conductive portion (36, 38) of each functional gate structure (33, 36, 38, 28). The gate contact (152, 154) thus is in contact with the topmost surfaces and entire outermost sidewalls of the gate conductive portion (36, 38) of each functional gate structure (34, 36, 38, 28).

In the second embodiment of the present application, in addition to contacting the topmost surfaces of the gate conductive portion (36, 38) of each functional gate structure (34, 36, 38, 28), the gate contact (152, 154) directly contacts the entire outermost sidewalls of the gate conductive portion (36, 38) of each functional gate structure (34, 36, 38, 28). Compared with the first exemplary gate contact (52, 54) illustrated in FIGS. 8A-8C, the increased contact area between the gate contact (152, 154) and the gate conductive portion (36, 38) of each functional gate structure (34, 36, 38, 38) can lead to a further reduction in the gate contact resistance, which in turn can further enhance the device performance.

FIGS. 11A-11C and 12A-12C are various top and cross-section views illustrating steps for forming a third exemplary gate contact with reduced contact resistance from the exemplary semiconductor structure of FIGS. 6A-6C in accordance with a third embodiment of the present application.

Referring to FIGS. 11A-11C, a gate contact trench 250 is formed to exposes a portion of the entire gate conductive portion (36, 38) of each functional gate structure (34, 36, 38, 28) that is located between the array of the first semiconductor fins 16A and the array of the second semiconductor fins 16B.

An anisotropic etch described above with respect to FIGS. 7A-7C is performed first to remove a portion of the contact level dielectric layer 50 exposed by the opening in the patterned mask layer and portions of the ILD layer 30, the gate spacer 28 and the vertical portions of the gate dielectric 34 underlying the exposed contact level dielectric layer 50 such that the top surface of the buried insulation layer 14 and sidewalls of the horizontal portions of the gate dielectric 34a are exposed. The anisotropic etch is continued until the top surfaces of the exposed portions of the buried insulation layer 14 are recessed below the bottommost surface of the gate dielectric 34. In one embodiment, the anisotropic etch can be a dry etch, such as, for example, RIE.

An isotropic etch selectively removing the dielectric materials of the buried insulator layer 14 and the gate dielectrics 34 is subsequently performed to laterally etch the horizontal portions of the gate dielectric 34 and portion of the buried insulator layer 14 underlying the exposed gate conductive portions (36, 38) of the functional gate structures (34, 36, 38, 28) to provide the gate contact trench 250. In one embodiment, the isotropic etch can be a wet etch employing a combination of hydrogen peroxide and hydrofluoric acid. The remaining portions of the gate spacer 28 are herein referred to as the gate spacer portions (not shown). The remaining portions of the gate dielectric 34 are herein referred to as the gate dielectric portions 234A. The gate contact trench 250 that is formed exposes portions of the entire gate conductive portions (36, 38) of the functional gate structures (34. 36. 38, 28) located between the array of the first semiconductor fins 16A and the array of the second semiconductor fins 16B.

After forming the gate contact trench 250, an optional plasma nitridation may be subsequently performed to nitridize portions of the gate dielectric portions 234A exposed on sidewalls of the gate contact trench 250 when the gate dielectric portions 34 is composed of a high-k dielectric material (not shown). The nitridation encapsulates exposed portions of the gate dielectric portions 234A to prevent oxygen ingress into the gate dielectric portions 234A.

Referring to FIGS. 12A-12C, a gate contact is formed within the gate contact trench 250 utilizing the same processing steps described above with respect to FIGS. 8A-8C. The gate contact includes a contact liner 252 formed on sidewalls and a bottom surface of the gate contact trench 250 and a contact plug 254 formed over the contact liner filling the gate contact trench 250. The gate contact (252, 254) extends through the contact level dielectric layer 50 and the ILD layer 30 and into the buried insulator layer 14. The gate plug 254 wraps around (i.e., completely surrounds) a portion of the gate conductive portion (36, 38) of each functional gate structure (33, 36, 38, 28) located between the array of the first semiconductor fins 16A and the array of the second semiconductor fins 16B. The gate contact (252, 254) thus is in direct contact with the all surfaces including topmost and bottommost surfaces and outermost sidewalls of a portion of the gate conductive portion of each functional gate structures (34, 36, 38, 28) located in a non-device region of the substrate.

In the third embodiment of the present application, the gate contact (252, 254) completely surrounds a portion of the gate conductive portion of each functional gate structure (34, 36, 38, 28) located in a non-device region of the substrate to maximize the contact area between the gate contact (252, 254) and the functional gate structure (34, 36, 38, 28). The maximized contact area can result in a significant reduction in the gate contact resistance. Furthermore, since the gate contact (252, 254) in accordance with the third embodiment forms a direct contact with both work function metal 36 and gate electrode 38, the overall gate contact resistance can be reduced due to the minimization of the vertical/interface resistance resulting from the indirect contact of the work function metal and the gate contact in the prior art.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:
   forming at least one gate structure on a substrate comprising a first device region and a second device region separated from one another by an insulating region, wherein the at least one gate structure overlies at least one channel portion of each of the first device region and the second device region and comprises a gate spacer, a U-shaped gate dielectric laterally surrounded by the gate spacer, and a gate conductive portion in contact with the U-shaped gate dielectric;
   forming a gate contact trench through a contact level dielectric layer and at least a portion of an interlevel dielectric (ILD) layer underlying the contact level dielectric layer, wherein the gate contact trench exposes a topmost surface and at least portions of outermost sidewalls of the gate conductive portion in a portion of the at least one gate structure located in the insulating region of the substrate; and
   forming a gate contact within the gate contact trench, wherein the gate contact is in contact with the topmost surface and the at least portions of the outermost sidewalls of the gate conductive portion located within the gate contact trench.

2. The method of claim 1, wherein the forming the gate contact trench comprises:
   forming a mask layer over the contact level dielectric layer;
   pattering the mask layer to form an opening therein, wherein the opening exposes a portion of the contact level dielectric layer overlying a portion of the at least one gate structure located in a portion of the insulating region; and
   removing the exposed portion of the contact level dielectric layer and at least portions of the ILD layer, the gate spacer and the U-shaped gate dielectric underlying the exposed portion of the contact level dielectric layer.

3. The method of claim 2, wherein the removing the exposed portion of contact level dielectric layer and the at least portions of the ILD layer, the gate spacer and the U-shaped gate dielectric is performed by an anisotropic etch.

4. The method of claim 3, wherein the anisotropic etch partially removes portions of the gate spacer and the U-shaped gate dielectric present on the outermost sidewalls of the gate conductive portion such that topmost surfaces of remaining portions of the gate spacer and the U-shaped gate dielectric are located between the topmost surface of the gate conductive portion and a bottommost surface of the gate conductive portion.

5. The method of claim 3, wherein the anisotropic etch completely removes portions of the gate spacer and the U-shaped gate dielectric present on the outermost sidewalls of the gate conductive portion such that topmost surfaces of remaining portions of the gate spacer and the U-shaped gate dielectric are coplanar with a bottommost surface of the gate conductive portion.

6. The method of claim 1, wherein the gate contact is in contact with the topmost surface and entire outermost sidewalls of the gate conductive portion.

7. The method of claim 1, wherein the forming the gate contact comprises:
   forming a contact liner material layer on a bottom surface and sidewalls of the gate contact trench and above a top surface of the contact level dielectric layer;
   forming a contact material layer on the contact liner material layer and above the top surface of the contact level dielectric layer, wherein the contact material layer completely fills the gate contact trench; and
   removing portions of the contact liner material layer and the contact material layer from the top surface of the contact level dielectric layer.

* * * * *